(12) United States Patent
Hiroi et al.

(10) Patent No.: US 8,318,410 B2
(45) Date of Patent: Nov. 27, 2012

(54) SULFUR ATOM-CONTAINING RESIST UNDERLAYER FILM FORMING COMPOSITION AND METHOD FOR FORMING RESIST PATTERN

(75) Inventors: Yoshiomi Hiroi, Toyama (JP); Tomohisa Ishida, Toyama (JP); Yoshihito Tsukamoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 284 days.

(21) Appl. No.: 12/812,967

(22) PCT Filed: Jan. 23, 2009

(86) PCT No.: PCT/JP2009/051109
§ 371 (c)(1),
(2), (4) Date: Jul. 15, 2010

(87) PCT Pub. No.: WO2009/096340
PCT Pub. Date: Aug. 6, 2009

(65) Prior Publication Data
US 2011/0053091 A1    Mar. 3, 2011

(30) Foreign Application Priority Data

Jan. 30, 2008  (JP) .................. 2008-019246
Mar. 10, 2008  (JP) .................. 2008-059105

(51) Int. Cl.
G03F 7/11  (2006.01)
G03F 7/38  (2006.01)
C08G 59/14  (2006.01)
C08G 59/42  (2006.01)
H01L 21/027  (2006.01)

(52) U.S. Cl. .............. 430/311; 430/271.1; 430/330; 430/325; 430/326; 528/360; 252/582; 438/952

(58) Field of Classification Search .............. None
See application file for complete search history.

(56) References Cited

U.S. PATENT DOCUMENTS 3,459,787 A * 8/1969 Weesner .................. 560/18
5,342,724 A * 8/1994 Wilson .................... 430/114

FOREIGN PATENT DOCUMENTS

| EP | 1757985 A1 * | 2/2007 |
|---|---|---|
| JP | A-07-084371 | 3/1995 |
| JP | A-08-227149 | 9/1996 |
| JP | A-10-268522 | 10/1998 |
| JP | A-2003-177547 | 6/2003 |
| JP | 2008-268702 a * | 11/2008 |
| JP | A-2008-546027 | 12/2008 |
| WO | WO 2005/088398 A1 | 9/2005 |
| WO | WO 2006/040918 A1 | 4/2006 |
| WO | WO 2008/038131 A1 | 4/2008 |

OTHER PUBLICATIONS

English translation of JP 2008-268702, A (2008) from machine translation from AIPN Japan Patent Office National Center for Industrial Property Information and Training, generated Jun. 13, 2012, 11 pages.*
International Search Report issued in Application No. PCT/JP2009/051109; Dated Apr. 21, 2009 (With Translation).

* cited by examiner

*Primary Examiner* — Cynthia Hamilton
(74) *Attorney, Agent, or Firm* — Oliff & Berridge, PLC

(57) ABSTRACT

It is an object to provide a resist underlayer film forming composition having a selection ratio of dry etching rate larger than that of a resist film and exhibiting a low k value and a high n value at a short wavelength such as that of an ArF excimer laser, and enabling the formation of a resist pattern having a desired shape. When the composition is produced or used, it is required that odor due to a raw material monomer causes no problem. The object is solved by a resist underlayer film forming composition for lithography containing a polymer having in backbone thereof, a disulfide bond (S—S bond), and a solvent. The polymer may be a product of a reaction between at least one type of compound (diepoxy compound) containing two epoxy groups and at least one type of dicarboxylic acid containing a disulfide bond.

9 Claims, 1 Drawing Sheet

(A)
(B)
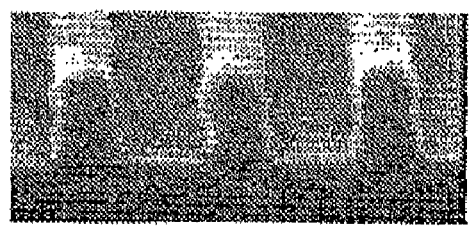
(C)
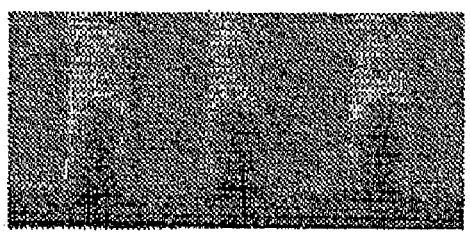
(D)
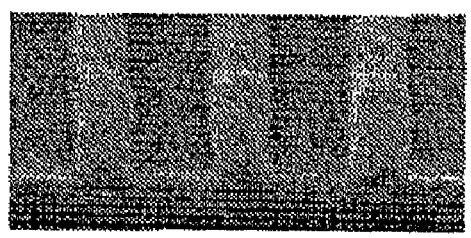
(E)

SULFUR ATOM-CONTAINING RESIST UNDERLAYER FILM FORMING COMPOSITION AND METHOD FOR FORMING RESIST PATTERN

TECHNICAL FIELD

The present invention relates to a composition for forming a resist underlayer film that is provided between a substrate and a resist film (resist layer) formed on the substrate and is suitable for a lithography process using an immersion exposure apparatus. During the exposure of a resist film, when a resist underlayer film reduces an influence of a reflected wave on the resist film, the resist underlayer film can be called an anti-reflective film.

BACKGROUND ART

Patent Document 1 discloses an anti-reflective film forming composition containing a polymer that contains sulfur atoms in a predetermined content. Patent Document 2 discloses an anti-reflective film forming composition for lithography containing a reaction product obtained by a polyaddition reaction between an epoxy compound having two glycidyl groups and a nitrogen-containing aromatic compound having two thiol groups.

However, with respect to a conventional anti-reflective film forming composition containing a sulfur atom-containing polymer, odor generated during the synthesis of the polymer may become a problem. A representative example in which odor becomes a problem is a case where a compound having a thiol group (—SH) is used as a raw material monomer for the sulfur atom-containing polymer.

Patent Document 1: International Publication No. WO 2005/088398 pamphlet

Patent Document 2: International Publication No. WO 2006/040918 pamphlet

DISCLOSURE OF THE INVENTION

Problems to be Solved by the Invention

It is required that the resist underlayer film can be readily formed by applying a liquid resist underlayer film forming composition and curing the composition. Accordingly, it is required that the composition is readily cured by heating or the like and contains a compound (polymer) having a high solubility in a predetermined solvent. The generation of odor when such a compound (polymer) is synthesized or when the reaction product is used is not preferable for workers, operators, and the like.

Further, a resist pattern formed on a resist underlayer film has desirably a substantially rectangular shape (a straight foot shape without so-called undercut, footing, or the like) as a sectional shape in a direction perpendicular to the substrate. For example, when a resist pattern has an undercut shape or a footing shape, there is caused a problem of collapse of the resist pattern or a problem that during a lithography process, an object (substrate, insulating film, and the like) to be processed cannot be processed into a desired shape or size.

The resist underlayer film is required to have a dry etching rate larger than that of a resist film on the resist underlayer film, that is, to have a selection ratio of dry etching rate larger than that of a resist film.

In recent years, the adoption of a lithography process using an immersion exposure apparatus in the production of semiconductor devices is studied. In this case, when the number of apertures (NA) of a projection lens of the immersion exposure apparatus becomes larger, a resist underlayer film having a high k value (attenuation coefficient or absorptivity) is undesirable for controlling the reflection of an incident wave, and rather a low k value is considered to be effective. A k value at a specific wavelength can be reduced by introducing an aromatic compound into the side chains of the polymer to shift the absorption wavelength. For example, naphthalene can reduce a k value at a wavelength of 193 nm. However, a resist underlayer film having a low k value at a wavelength of 193 nm may also have a low refractive index (n value) at the same wavelength.

It is an object of the present invention to provide a resist underlayer film forming composition having a selection ratio of dry etching rate larger than that of a resist film and exhibiting a low k value and a high n value at a short wavelength such as that of an ArF excimer laser (wavelength: about 193 nm). It is another object of the present invention to provide a resist underlayer film forming composition that allows a resist pattern formed on the resist underlayer film to have the above-described desired shape. Further, it is another object of the present invention to provide a resist underlayer film forming composition with which odor due to a raw material monomer causes no problem during the synthesis of the polymer component or the like.

Means for Solving the Problems

A first aspect of the present invention is a resist underlayer film forming composition for lithography containing a polymer having in backbone thereof, a disulfide bond, that is, a "S—S" bond, and a solvent. In the first aspect of the present invention, the polymer means a polymerized substance and is not necessarily limited to a macromolecular compound. Accordingly, a monomer is excluded from "the polymer", but an oligomer is not excluded therefrom.

The polymer is a product of a reaction between at least one type of compound (hereinafter, called a compound A) containing two epoxy groups and at least one type of dicarboxylic acid (hereinafter, called a compound B) containing a disulfide bond. In other words, the polymer can be obtained by dissolving the compound A and the compound B in a solvent so that these compounds have an appropriate molar ratio and by polymerizing these compounds in the presence of a catalyst activating an epoxy group. The compound having two epoxy groups is also expressed as a diepoxy compound. Examples of the catalyst activating an epoxy group include quaternary phosphonium salts such as triphenylmonoethylphosphonium bromide and quaternary ammonium salts such as benzyltriethylammonium chloride. The catalyst can be used in an appropriate amount selected from a range of 0.1% by mass to 10% by mass, based on the total mass of the compound A and the compound B as the raw material monomers. The temperature and the time for the polymerization reaction are selected from a range of 80° C. to 160° C. and a range of 2 hours to 50 hours, respectively, as the optimal conditions. In the compound B, the dicarboxylic acid means a compound having two carboxy groups. Accordingly, the compound B can also be expressed as at least one type of compound containing a disulfide bond and two carboxy groups. Then, the compound B contains two carboxy groups and thus does not necessarily contain a thiol group.

Examples of the compound containing two epoxy groups include compounds of Formulae (a) to (h) below and examples of the dicarboxylic acid containing a disulfide bond include compounds of Formulae (i) to (k) below. However, the present invention is not limited to these examples. In Formula (h), $R^0$ is a $C_{2-6}$ alkylene group.

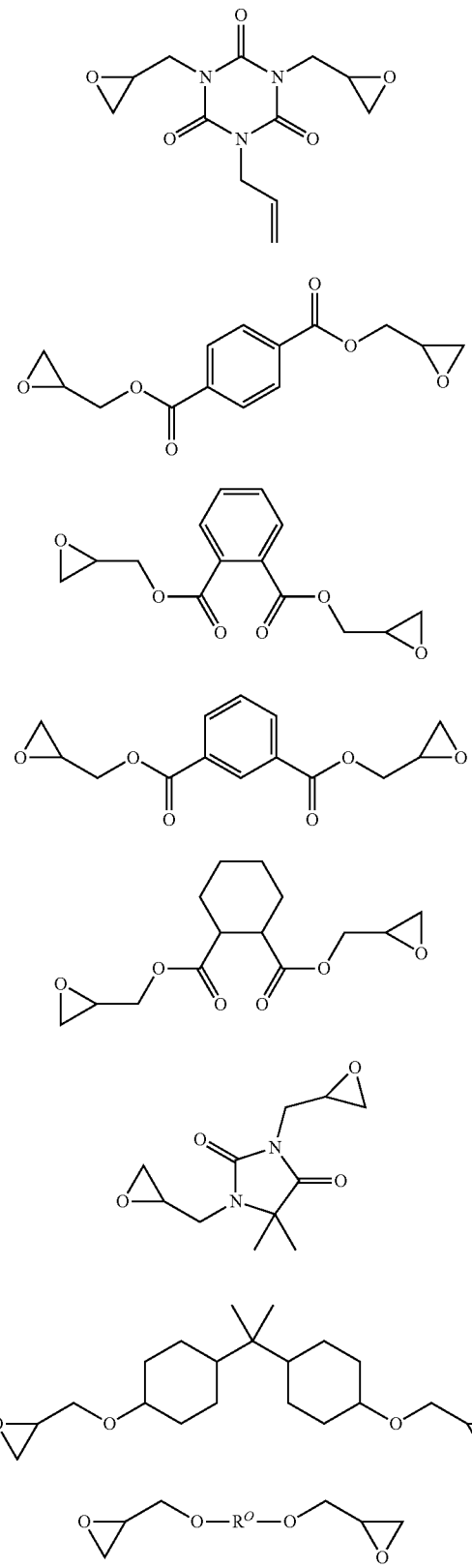

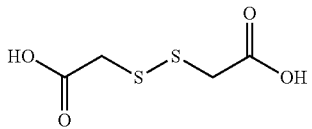

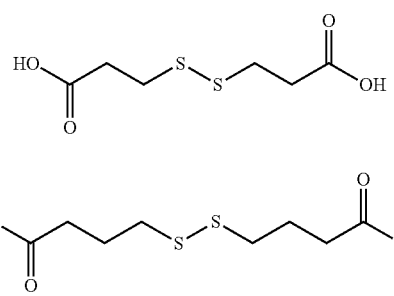

The polymer contained in the resist underlayer film forming composition of the first aspect of the present invention has, for example, a repeating unit structure of Formula (1):

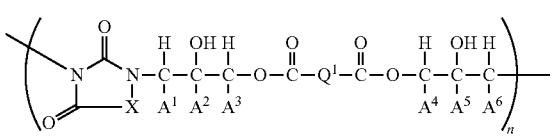

[where X is a group of Formula (2), Formula (3), or Formula (4):

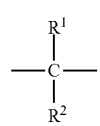

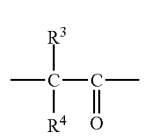

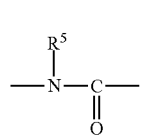

(where $R^1$ to $R^5$ are each independently a hydrogen atom, a $C_{1-6}$ alkyl group, a $C_{3-6}$ alkenyl group, a benzyl group, or a phenyl group, where the phenyl group may be substituted with at least one group selected from a group consisting of a $C_{1-6}$ alkyl group, a halogen atom, a $C_{1-6}$ alkoxy group, a nitro group, a cyano group, and a $C_{1-6}$ alkylthio group, and $R^1$ and $R^2$ or $R^3$ and $R^4$ may be bonded to each other to form a $C_{3-6}$ ring); $A^1$ to $A^6$ are each independently a hydrogen atom, a methyl group, or an ethyl group; $Q^1$ is a divalent group containing a disulfide bond; and n is the number of repeating unit structures which is an integer of 5 to 100].

Formula (1) is, for example Formula (5):

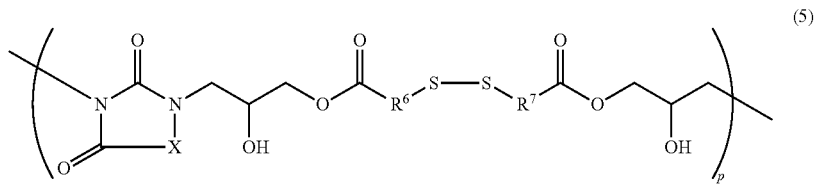

[where X is a group of Formula (2), Formula (3), or Formula (4); $R^6$ and $R^7$ are each independently a $C_{1-3}$ alkylene group or a direct bond; and p is the number of repeating unit structures which is an integer of 5 to 100].

A second aspect of the present invention is a resist underlayer film forming composition for lithography containing a polymer having a repeating unit structure of Formula (1'):

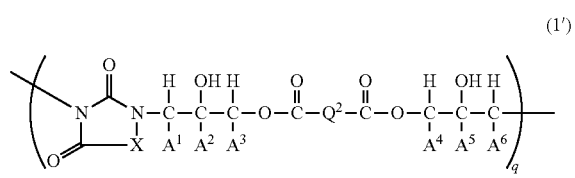

[where X is a group of Formula (2), Formula (3), or Formula (4):

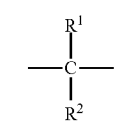

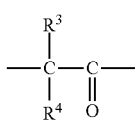

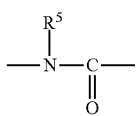

(where $R^1$ to $R^5$ are each independently a hydrogen atom, a $C_{1-6}$ alkyl group, a $C_{3-6}$ alkenyl group, a benzyl group, or a phenyl group, where the phenyl group may be substituted with at least one group selected from a group consisting of a $C_{1-6}$ alkyl group, a halogen atom, a $C_{1-6}$ alkoxy group, a nitro group, a cyano group, and a $C_{1-6}$ alkylthio group, and $R^1$ and $R^2$ or $R^3$ and $R^4$ may be bonded to each other to form a $C_{3-6}$ ring); $A^1$ to $A^6$ are each independently a hydrogen atom, a methyl group, or an ethyl group; $Q^2$ is a divalent group having a sulfur atom; and q is the number of repeating unit structures which is an integer of 5 to 100], and a solvent.

In the second aspect of the present invention, the polymer means a polymerized substance that is not necessarily limited to a macromolecular compound. Accordingly, a monomer is excluded from "the polymer", but an oligomer is not excluded therefrom. The number of sulfur atoms contained in the divalent group of $Q^2$ is not limited and may be, for example 1 or 2.

The polymer is a product of a reaction between at least one type of diepoxy compound and at least one type of dicarboxylic acid having a sulfur atom. In other words, the polymer can be obtained by dissolving a diepoxy compound and a dicarboxylic acid which are raw material monomers in a solvent so that these compounds have an appropriate molar ratio and by polymerizing these compounds in the presence of a catalyst activating an epoxy group. Examples of the catalyst activating an epoxy group include quaternary phosphonium salts such as triphenylmonoethylphosphonium bromide and quaternary ammonium salts such as benzyltriethylammonium chloride. The catalyst can be used in an appropriate amount selected from a range of 0.1% by mass to 10% by mass, based on the total mass of the diepoxy compound and the dicarboxylic acid as the raw material monomers. The temperature and the time for the polymerization reaction are selected from a range of 80° C. to 160° C. and a range of 2 hours to 50 hours, respectively, as the optimal conditions. The diepoxy compound means a compound having two epoxy groups and the dicarboxylic acid means a compound having two carboxy groups. Then, in the second aspect of the present invention, the raw material monomer contains no thiol group.

Examples of the dicarboxylic acid having a sulfur atom include compounds of Formulae (l) to (p):

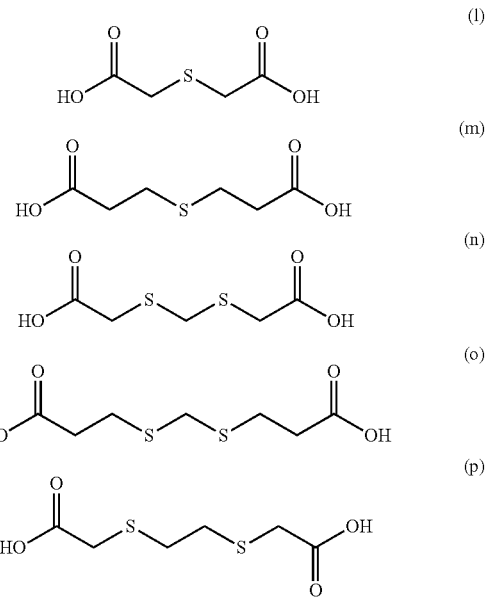

However, the present invention is not limited to the examples. Examples of the diepoxy compound are already shown in the present specification as compounds of Formulae (a) to (h).

Formula (1') is, for example Formula (6):

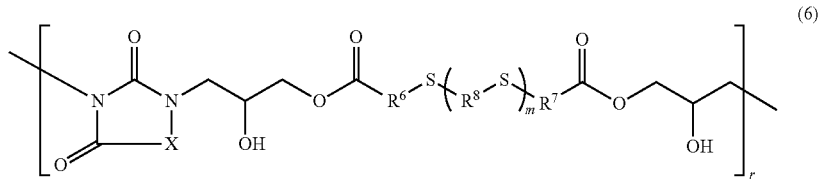

[where X is a group of Formula (2), Formula (3), or Formula (4); $R^6$ and $R^7$ are each independently a $C_{1-3}$ alkylene group or a direct bond; $R^8$ is a $C_{1-3}$ alkylene group; m is 0 or 1; and r is the number of repeating unit structures which is an integer of 5 to 100].

The resist underlayer film forming compositions according to the first and the second aspects of the present invention can be used in a lithography process of a production process of a semiconductor device. The lithography process includes: applying the resist underlayer film forming composition as described in any one of the first and the second aspect of the present invention on a semiconductor substrate and baking the composition to form a resist underlayer film; applying a resist on the resist underlayer film and baking the resist to form a resist film; exposing the semiconductor substrate coated with the resist underlayer film and the resist film to light; and developing the resist film after the exposure, and a resist pattern is formed on the resist underlayer film.

A representative substrate of the semiconductor substrate is a silicon wafer. However, an SOI (silicon on insulator) substrate or a wafer of a compound semiconductor such as gallium arsenide (GaAs), indium phosphide (InP), and gallium phosphide (GaP) may be used. A semiconductor substrate on which an insulating film such as a silicon oxide film, a nitrogen-containing silicon oxide film (SiON film), and a carbon-containing silicon oxide film (SiOC film) is formed may also be used, and in this case, the resist underlayer film forming composition is applied on the insulating film.

As the light source for the exposure, an ArF excimer laser can be used. Instead of the ArF excimer laser, EUV (wavelength: 13.5 nm) or an electron beam may also be used. "EUV" is an abbreviation of an extreme ultraviolet ray. The resist for forming the resist film may be either a positive resist or a negative resist. As the resist, a chemical amplification-type resist photosensitive to an ArF excimer laser, EUV, or an electron beam can be used.

Effects of the Invention

The resist underlayer film forming composition of the present invention contains a polymer having a disulfide bond in the backbone thereof or a polymer having a repeating unit structure of Formula (1'), with which a sulfur atom having characteristics of high n value and low k value at a wavelength of 193 nm can be efficiently introduced into the composition. The resist underlayer film forming composition of the present invention is characterized in that odor doe to the raw material monomer is low to an extent that does not cause a problem. A resist underlayer film formed from such a composition exhibits a high reflected-light preventing effect in a lithography process adopting an immersion exposure apparatus and using a short-wavelength radiated light such as an ArF excimer laser and can obtain a k value adjusted at a suitable value. Then, a resist pattern causing no intermixing with the resist film and having an advantageous shape can be formed on the resist underlayer film. Further, the resist underlayer film can be removed in a time much shorter than that for the resist pattern by dry etching with a gas such as $CF_4$ and $CHF_3$.

BEST MODES FOR CARRYING OUT THE INVENTION

Specific examples of the solvent contained in the resist underlayer film forming composition of the present invention include propylene glycol monomethyl ether (PGME), propylene glycol monomethyl ether acetate (PGMEA), propylene glycol monopropyl ether, methyl ethyl ketone, ethyl lactate, cyclohexanone, γ-butyrolactone, N-methylpyrrolidone, and a mixture of two or more types selected from these solvents. The content of the solvent in the resist underlayer film forming composition of the present invention is, for example, at least 90% by mass up to 99.9% by mass.

The resist underlayer film forming composition of the present invention may further contain a crosslinkable compound and a sulfonic acid compound. The content of the sulfonic acid compound is, for example, at least 0.1% by mass up to 13% by mass, preferably, at least 0.5% by mass up to 5% by mass, relative to the polymer contained in the resist underlayer film forming composition of the present invention. The crosslinkable compound is also expressed as a crosslinker and examples thereof include nitrogen-containing compounds having 2 to 4 nitrogen atoms substituted with a methylol group or an alkoxymethyl group. The content of the crosslinkable compound is, for example, at least 5% by mass up to 50% by mass, relative to the polymer contained in the resist underlayer film forming composition of the present invention.

Specific examples of the sulfonic acid compound include p-toluenesulfonic acid, trifluoromethanesulfonic acid, pyridinium-p-toluenesulfonate, camphorsulfonic acid, 5-sulfosalicylic acid, 4-chlorobenzenesulfonic acid, 4-hydroxybenzenesulfonic acid, benzenedisulfonic acid, and 1-napthalenesulfonic acid. Specific examples of the crosslinkable compound (crosslinker) include hexamethoxymethylmelamine, tetramethoxymethylbenzoguanamine, 1,3,4,6-tetrakis(methoxymethyl)glycoluril, 1,2,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

The sulfonic acid compound acts as a crosslinking accelerator. For example, 4-hydroxybenzenesulfonic acid (also called p-phenolsulfonic acid) is an additive that suppresses a cross section of the resist pattern in a direction perpendicular to the substrate from becoming a footing-shape and contributes to formation of the desired cross-sectional shape (substantially rectangular shape).

The resist underlayer film forming composition of the present invention may contain a phenol derivative. The phenol derivative is an additive that suppresses a cross section of the resist pattern in a direction perpendicular to the substrate from becoming a footing-shape and contributes to formation of the desired cross-sectional shape (substantially rectangular shape), same as 4-hydroxybenzenesulfonic acid. Specific examples of the phenol derivative include 4-methylsulfonylphenol, bisphenol S, bisphenol AF, 4-cyanophenol, 3,4,5-trifluorophenol, 4-hydroxybenzotrifluoride, 2,3,5,6-tetrafluoro-4-(trifluoromethyl)phenol, 2,6-dichloro-4-(methylsulfonyl)phenol. The content of the phenol derivative is, for example, 0.1% by mass or more and 20% by mass or less, relative to the polymer contained in the resist underlayer film forming composition of the present invention.

The resist underlayer film forming composition of the present invention may contain a surfactant. The surfactant is an additive for enhancing the coating property of the composition to the substrate. As the surfactant, a known surfactant such as nonionic surfactants and fluorinated surfactants may be used and the additive amount thereof may be, for example, at least 0.1% by mass up to 5% by mass, relative to the polymer contained in the resist underlayer film forming composition of the present invention.

In the resist underlayer film forming composition of the present invention, when a component remaining after subtracting the solvent from the whole composition is defined as the solid content, the solid content contains the polymer and the above-described various additives that are added to the composition as needed.

EXAMPLES

The weight average molecular weight shown in the following Synthetic Examples of the present specification is the result of the measurement by gel permeation chromatography (hereinafter, abbreviated as GPC). For the measurement, a GPC apparatus manufactured by Tosoh Corporation was used and the conditions for the measurement were as follows.

GPC column: Shodex (registered trademark), Asahipak (registered trademark) (Showa Denko K.K.)

Column temperature: 40° C.
Solvent: N,N-dimethylformamide (DMF)
Flow rate: 0.6 mL/min
Standard sample: polystyrene (Tosoh Corporation)

Synthesis Example 1

5.0 g of monoallyldiglycidylisocyanuric acid (Shikoku Chemicals Corporation; trade name: MADGIC), 3.8 g of 3,3'-dithiodipropionic acid (Sakai Chemical Industry Co., Ltd.; trade name: DTDPA), and 0.3 g of triphenylmonoethylphosphonium bromide which is a quaternary phosphonium salt as a catalyst were dissolved in 13.8 g of propylene glycol monomethyl ether. Subsequently, the resultant solution was warmed to 120° C., followed by stirring the reaction solution in a nitrogen atmosphere for 4 hours. The odor of the raw material compounds and the odor of the reaction products were nearly at an unnoticeable level. The obtained reaction product was diluted with 23.0 g of propylene glycol monomethyl ether to prepare a vanish solution and the vanish solution was subjected to a GPC analysis. As a result of the analysis, the reaction product was found to have a weight average molecular weight of about 7,800 in terms of standard polystyrene. This reaction product has a repeating unit structure of Formula (7):

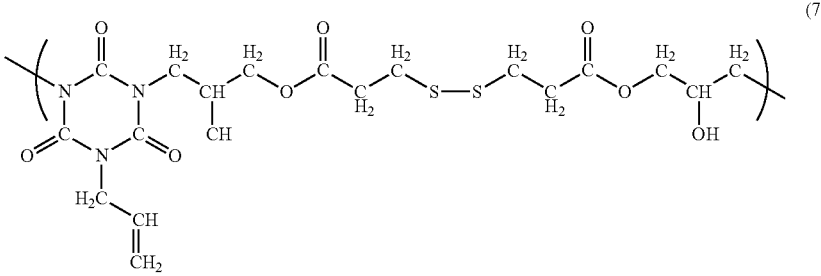

Synthesis Example 2

14.0 g of monoallyldiglycidylisocyanuric acid (Shikoku Chemicals Corporation; trade name: MADGIC), 2.6 g of monoallylisocyanuric acid (Shikoku Chemicals Corporation), 7.4 g of 3,3'-dithiodipropionic acid (manufactured by Sakai Chemical Industry Co., Ltd.; trade name: DTDPA), and 0.6 g of benzyltriethylammonium chloride which is a quaternary ammonium salt as a catalyst were dissolved in 57.3 g of propylene glycol monomethyl ether. Subsequently, the resultant solution was warmed to 120° C., followed by stirring the reaction solution in a nitrogen atmosphere for 4 hours. The odor of the raw material compounds and the odor of the reaction products were nearly at an unnoticeable level. The obtained reaction product was diluted with 40.9 g of propylene glycol monomethyl ether to prepare a vanish solution and the vanish solution was subjected to a GPC analysis. As a result of the analysis, the reaction product was found to have a weight average molecular weight of about 8,800 in terms of standard polystyrene. This reaction product has a repeating unit structure of Formula (8):

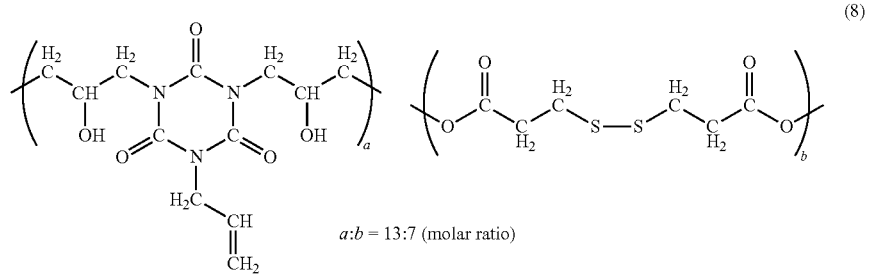

(8)

a:b = 13:7 (molar ratio)

Synthesis Example 3

10.00 g of monoallyldiglycidylisocyanuric acid (Shikoku Chemicals Corporation; trade name: MADGIC), 4.98 g of ethanedithiol (Shikoku Chemicals Corporation), and 0.40 g of benzyltriethylammonium chloride which is a quaternary ammonium salt as a catalyst were dissolved in 61.52 g of propylene glycol monomethyl ether and the reaction of the resultant solution was effected under reflux for 24 hours. Among the raw material compounds (monomers), ethanedithiol, in particular, had a strong odor in comparison with other sulfur-containing compounds used in other Synthetic Examples of the present specification. The odor is due to a thiol group of ethanedithiol. A vanish solution containing the obtained reaction product was subjected to a GPC analysis. As a result of the analysis, the reaction product was found to have a weight average molecular weight of about 16,800 in terms of standard polystyrene. This reaction product has a repeating unit structure of Formula (9):

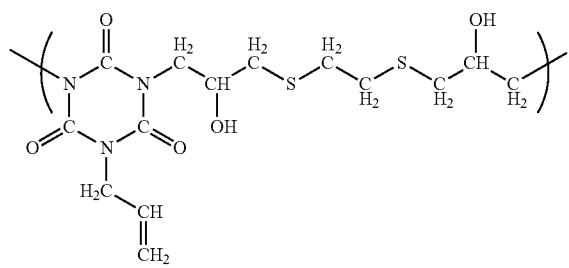

(9)

containing no disulfide bond (S—S bond).

Synthesis Example 4

5.0 g of monoallyldiglycidylisocyanuric acid (Shikoku Chemicals Corporation; trade name: MADGIC), 3.1 g of suberic acid (Tokyo Chemical Industry Co., Ltd.) of COOH $(CH_2)_6$COOH, and 0.3 g of triphenylmonoethylphosphonium bromide which is a quaternary phosphonium salt as a catalyst were dissolved in 8.5 g of propylene glycol monomethyl ether. Subsequently, the resultant solution was warmed to 120° C., followed by stirring the reaction solution in a nitrogen atmosphere for 4 hours. The obtained reaction product was diluted with 25.40 g of propylene glycol monomethyl ether to prepare a vanish solution and the vanish solution was subjected to a GPC analysis. As a result of the analysis, the reaction product was found to have a weight average molecular weight of about 6,800 in terms of standard polystyrene. This reaction product has a repeating unit structure of Formula (10):

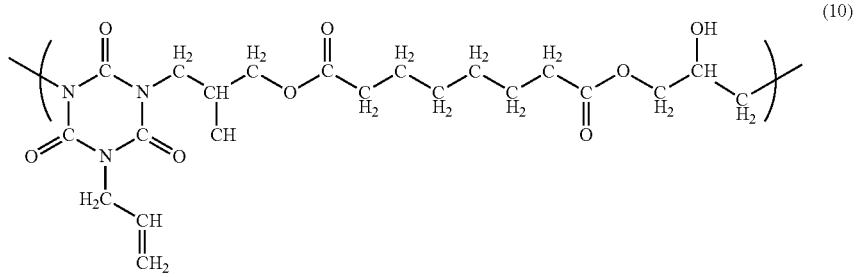

(10)

containing no sulfur atom.

Synthesis Example 5

5.201 g of monoallyldiglycidylisocyanuric acid (Shikoku Chemicals Corporation; trade name: MADGIC), 3.335 g of 3,3'-thiodipropionic acid (Tokyo Chemical Industry Co., Ltd.), and 0.3764 g of triphenylmonoethylphosphonium bromide which is a quaternary phosphonium salt as a catalyst were dissolved in 13.087 g of propylene glycol monomethyl ether. Subsequently, the reaction of the resultant solution was effected at 120° C. for 4 hours to produce a solution containing the reaction product. The solution containing the reaction product was subjected to a GPC analysis and as a result of the analysis, the reaction product was found to have a weight average molecular weight of about 4,500 in terms of standard polystyrene. This reaction product has a repeating unit structure of Formula (11):

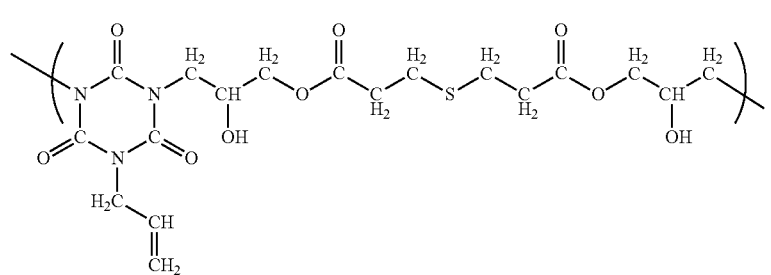

(11)

Synthesis Example 6

5.009 g of monoallyldiglycidylisocyanuric acid (Shikoku Chemicals Corporation; trade name: MADGIC), 3.537 g of methylenebis(thioglycolic acid) (Tokyo Chemical Industry Co., Ltd.), and 0.3625 g of triphenylmonoethylphosphonium bromide which is a quaternary phosphonium salt were dissolved in 13.091 g of propylene glycol monomethyl ether. Subsequently, the reaction was effected at 120° C. for 4 hours to produce a solution containing the reaction product. The solution containing the reaction product was subjected to a GPC analysis and as a result of the analysis, the reaction product was found to have a weight average molecular weight of about 9,200 in terms of standard polystyrene. This reaction product has a repeating unit structure of Formula (12):

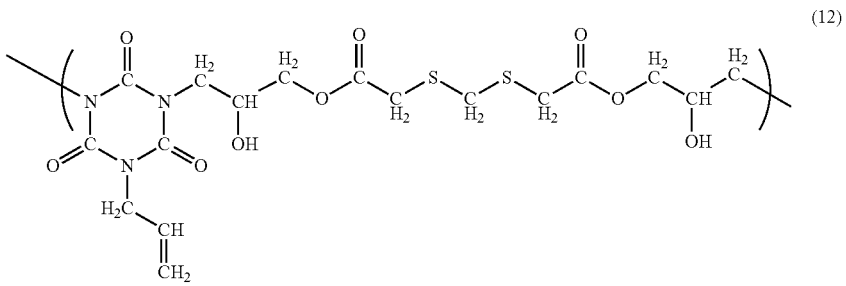

(12)

Synthesis Example 7

5.000 g of monoallyldiglycidylisocyanuric acid (Shikoku Chemicals Corporation; trade name: MADGIC), 3.790 g of (ethylenedithio)diacetic acid (Tokyo Chemical Industry Co., Ltd.), and 0.3058 g of tetraethylphosphonium bromide (Tokyo Chemical Industry Co., Ltd.) which is a quaternary phosphonium salt were dissolved in 36.384 g of propylene glycol monomethyl ether. Subsequently, the reaction of the solution was effected at 120° C. for 4 hours to produce a solution containing the reaction product. The solution containing the reaction product was subjected to a GPC analysis and as a result of the analysis, the reaction product was found to have a weight average molecular weight of about 5,200 in terms of standard polystyrene. This reaction product has a repeating unit structure of Formula (13):

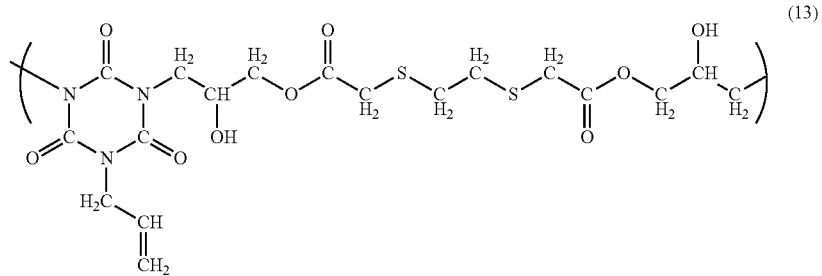

(13)

Synthesis Example 8

5.000 g of monoallyldiglycidylisocyanuric acid (Shikoku Chemicals Corporation; trade name: MADGIC), 2.707 g of 2,2'-thiodiglycolic acid (Tokyo Chemical Industry Co., Ltd.), and 0.3058 g of tetraethylphosphonium bromide (Tokyo Chemical Industry Co., Ltd.) which is a quaternary phosphonium salt were dissolved in 32.049 g of propylene glycol monomethyl ether. Subsequently, the reaction of the resultant solution was effected at 120° C. for 4 hours to produce a solution containing the reaction product. The solution containing the reaction product was subjected to a GPC analysis and as a result of the analysis, the reaction product was found to have a weight average molecular weight of about 4,500 in terms of standard polystyrene. This reaction product has a repeating unit structure of Formula (14):

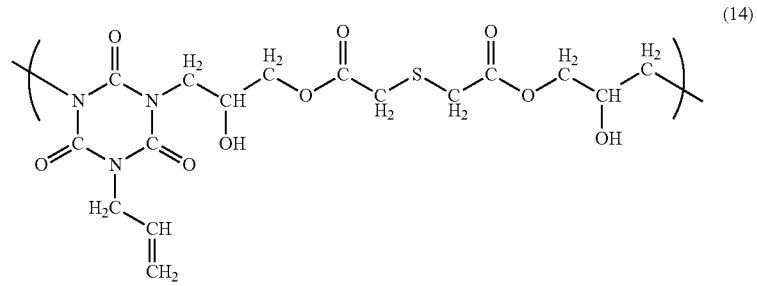

Example 1

To 1.459 g of a solution containing 0.234 g of the reaction product obtained in Synthesis Example 1, 19.566 g of propylene glycol monomethyl ether, 8.910 g of propylene glycol monomethyl ether acetate, 0.059 g of tetramethoxymethylglycoluril (Nihon Cytec Industries Inc.; trade name: POWDERLINK (registered trademark) 1174), 0.006 g of p-phenolsulfonic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 2

To 1.353 g of a solution containing 0.217 g of the reaction product obtained in Synthesis Example 1, 19.655 g of propylene glycol monomethyl ether, 8.910 g of propylene glycol monomethyl ether acetate, 0.054 g of tetramethoxymethylglycoluril (Nihon Cytec Industries Inc.; trade name: POWDERLINK (registered trademark) 1174), 0.027 g of p-phenolsulfonic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 3

To 1.391 g of a solution containing 0.223 g of the reaction product obtained in Synthesis Example 1, 19.623 g of propylene glycol monomethyl ether, 8.910 g of propylene glycol monomethyl ether acetate, 0.056 g of tetramethoxymethylglycoluril (Nihon Cytec Industries inc.; trade name: POWDERLINK (registered trademark) 1174), 0.014 g of 4-methylsulfonylphenol (Acros Organics), 0.006 g of p-phenolsulfonic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 4

To 1.504 g of a solution containing 0.233 g of the reaction product obtained in Synthesis Example 1, 25.460 g of propylene glycol monomethyl ether, 2.970 g of propylene glycol monomethyl ether acetate, 0.058 g of tetramethoxymethylglycoluril (Nihon Cytec Industries Inc.; trade name: POWDERLINK (registered trademark) 1174), 0.002 g of 4-methylsulfonylphenol (Acros Organics), 0.006 g of p-phenolsulfonic acid (Tokyo Chemical Industry Co., Ltd.), and 0.005 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 5

To 1.391 g of a solution containing 0.223 g of the reaction product obtained in Synthesis Example 1, 19.623 g of propylene glycol monomethyl ether, 8.910 g of propylene glycol monomethyl ether acetate, 0.056 g of tetramethoxymethylglycoluril (Nihon Cytec Industries Inc.; trade name: POWDERLINK (registered trademark) 1174), 0.014 g of bisphenol S (Tokyo Chemical Industry Co., Ltd.), 0.006 g of p-phenolsulfonic acid (Tokyo Chemical Industry Co., Ltd.), and 0.005 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 6

To 1.391 g of a solution containing 0.223 g of the reaction product obtained in Synthesis Example 1, 19.623 g of propylene glycol monomethyl ether, 8.910 g of propylene glycol monomethyl ether acetate, 0.056 g of tetramethoxymethylglycoluril (Nihon Cytec industries Inc.; trade name: POWDERLINK (registered trademark) 1174), 0.014 g of bispbenol AF (Tokyo Chemical Industry Co., Ltd.), 0.006 g of p-phenolsulfonic acid (Tokyo Chemical Industry Co., Ltd.), and 0.005 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 7

To 1.391 g of a solution containing 0.223 g of the reaction product obtained in Synthesis Example 1, 19.623 g of propylene glycol monomethyl ether, 8.910 g of propylene glycol monomethyl ether acetate, 0.056 g of tetramethoxymethylglycoluril (Nihon Cytec Industries Inc.; trade name: POWDERLINK (registered trademark) 1174), 0.014 g of 4-cyanophenol (Tokyo Chemical Industry Co., Ltd.), 0.006 g of p-phenolsulfonic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 8

To 1.391 g of a solution containing 0.223 g of the reaction product obtained in Synthesis Example 1, 19.623 g of propylene glycol monomethyl ether, 8.910 g of propylene glycol monomethyl ether acetate, 0.056 g of tetramethoxymethylglycoluril (Nihon Cytec Industries Inc.; trade name: POWDERLINK (registered trademark) 1174), 0.014 g of 3,4,5-trifluorophenol (Tokyo Chemical Industry Co., Ltd.), 0.006 g of p-phenolsulfonic acid (Tokyo Chemical Industry Co., Ltd.), and 0.005 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 9

To 1.412 g of a solution containing 0.234 g of the reaction product obtained in Synthesis Example 2, 27.038 g of propylene glycol monomethyl ether, 1.485 g of propylene glycol monomethyl ether acetate, 0.059 g of tetramethoxymethylglycoluril (Nihon Cytec Industries Inc.; trade name: POWDERLINK (registered trademark) 1174), 0.006 g of 5-sulfosalicylic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 10

To 1.412 g of a solution containing 0.234 g of the reaction product obtained in Synthesis Example 2, 27.038 g of propylene glycol monomethyl ether, 1.485 g of propylene glycol monomethyl ether acetate, 0.059 g of tetramethoxymethylglycoluril (Nihon Cytec Industries Inc.; trade name: POWDERLINK (registered trademark) 1174), 0.006 g of p-phenolsulfonic acid (Tokyo Chemical Industry Co., Ltd.), and 0.001 g of a surfactant (DIC Corporation; trade name; R-30) were added to prepare a solution. Subsequently, the solution was filtered using a polyethylene microfilter having a pore diameter of 0.10 μm to prepare a resist underlayer film forming composition.

Example 11

To 3.433 g of a solution containing 0.927 g of the reaction product obtained in Synthesis Example 5, 23.4 g of propylene glycol monomethyl ether, 2.88 g of propylene glycol monomethyl ether acetate, 0.23 g of tetramethoxymethylglycoluril (manufactured by Nihon Cytec Industries Inc.; trade name: POWDERLINK (registered trademark) 1174), 0.023 g of p-phenolsulfonic acid, and 0.018 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 12

To 3.275 g of a solution containing 0.884 g of the reaction product obtained in Synthesis Example 5, 23.5 g of propylene glycol monomethyl ether, 2.88 g of propylene glycol monomethyl ether acetate, 0.22 g of tetramethoxymethylglycoluril (manufactured by Nihon Cytec Industries Inc.; trade name: POWDERLINK (registered trademark) 1174), 0.055 g of bisphenol S (Tokyo Chemical Industry Co., Ltd.), 0.022 g of p-phenolsulfonic acid, and 0.018 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 13

To 3.358 g of a solution containing 0.927 g of the reaction product obtained in Synthesis Example 6, 23.5 g of propylene glycol monomethyl ether, 2.88 g of propylene glycol monomethyl ether acetate, 0.23 g of tetramethoxymethylglycoluril (manufactured by Nihon Cytec Industries Inc.; trade name: POWDERLINK (registered trademark) 1174), 0.023 g of p-phenolsulfonic acid, and 0.018 g of a surfactant (manufactured by DIC Corporation; trade name: R-30) were added to prepare a solution. Subsequently, the solution was filtered using a polyethylene microfilter having a pore diameter of 0.10 μm to prepare a resist underlayer film forming composition.

Example 14

To 3.204 g of a solution containing 0.884 g of the reaction product obtained in Synthesis Example 6, 23.6 g of propylene glycol monomethyl ether, 2.88 g of propylene glycol monomethyl ether acetate, 0.22 g of tetramethoxymethylglycoluril (Nihon Cytec Industries Inc.; trade name; POWDERLINK (registered trademark) 1174), 0.055 g of bisphenol S (Tokyo Chemical Industry Co., Ltd.), 0.022 g of p-phenolsulfonic acid, and 0.018 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

Example 15

To 1.293 g of a solution containing 0.235 g of the reaction product obtained in Synthesis Example 7, 19.7 g of propylene glycol monomethyl ether, 8.91 g of propylene glycol monomethyl ether acetate, 0.059 g of tetramethoxymethylglycoluril (Nihon Cytec Industries Inc.; trade name: POWDERLINK (registered trademark) 1174), and 0.006 g of pyridinium-p- toluenesulfonate were added to prepare a solution. Subsequently, the solution was filtered using a polyethylene microfilter having a pore diameter of 0.10 μm to prepare a resist underlayer film forming composition.

Example 16

To 1.265 g of a solution containing 0.235 g of the reaction product obtained in Synthesis Example 8, 19.76 g of propylene glycol monomethyl ether, 8.91 g of propylene glycol monomethyl ether acetate, 0.059 g of tetramethoxymethylglycoluril (manufactured by Nihon Cytec Industries Inc.; trade name: POWDERLINK (registered trademark) 1174), and 0.006 g of pyridinium-p-toluenesulfonate were added to prepare a solution. Subsequently, the solution was filtered using a polyethylene microfilter having a pore diameter of 0.10 μm to prepare a resist underlayer film forming composition.

Comparative Example 1

To 3.92 g (polymer concentration: 20% by mass) of a solution containing the reaction product obtained in Synthesis Example 3, 0.20 g of tetramethoxymethylglycoluril (Nihon Cytec Industries Inc.; trade name: POWDERLINK (registered trademark) 1174), 0.02 g of pyridinium-p-toluenesulfonate (Tokyo Chemical Industry Co., Ltd.), 6.36 g of propylene glycol monomethyl ether, and 9.5 g of ethyl lactate were added to prepare a solution. Subsequently, the solution was filtered using a polyethylene microfilter having a pore diameter of 0.05 μm to prepare a resist underlayer film forming composition.

Comparative Example 2

To 0.960 g of a solution containing 0.172 g of the reaction product obtained in Synthesis Example 4, 18.003 g of propylene glycol monomethyl ether, 0.989 g of propylene glycol monomethyl ether acetate, 0.043 g of tetramethoxymethylglycoluril (Nihon Cytec Industries Inc.; trade name: POWDERLINK (registered trademark) 1174), 0.004 g of 5-sulfosalicylic acid (Tokyo Chemical Industry Co., Ltd.), and 0.001 g of a surfactant (DIC Corporation; trade name: R-30) were added to prepare a solution. Subsequently, the solution was filtered using a polyethylene microfilter having a pore diameter of 0.10 μm to prepare a resist underlayer film forming composition.

(Test for Optical Parameter)

Each of the resist underlayer film forming compositions prepared in Examples 1 to 16 and Comparative Examples 1 and 2 described in the present specification was applied on a silicon wafer using a spinner. The composition was baked on a hot plate at 205° C. for 1 minute to form a resist underlayer film (film thickness: 0.06 μm). Then, the n value (refractive index) and the k value (attenuation coefficient or absorptivity) of the resist underlayer film at a wavelength of 193 nm were measured using a spectroscopic ellipsometer (manufactured by J.A. Woollam Co., Inc.; VUV-VASE VU-302). The result of the measurement is shown in Table 1.

(Measurement of Dry Etching Rate)

Each of the resist underlayer film forming compositions prepared in Examples 1 to 16 and Comparative Examples 1 and 2 described in the present specification was applied on a silicon wafer using a spinner. The composition was baked on a hot plate at 205° C. for 1 minute to form a resist underlayer film. Then, the dry etching rate (the amount of reduction in film thickness per unit time) of the resist underlayer film was measured using RIE system ES401 manufactured by Nippon Scientific Co., Ltd. under a condition of using $CF_4$ as a dry etching gas.

A photoresist solution (manufactured by Sumitomo Chemical Co., Ltd.; trade name: PAR710) was applied on a silicon wafer using a spinner and the solution was baked on a hot plate at 90° C. for 1 minute to form a photoresist film. Then, the dry etching rate of the photoresist film was measured using RIE system ES401 manufactured by Nippon Scientific Co., Ltd. under a condition of using $CF_4$ as a dry etching gas.

The dry etching rate of each of the resist underlayer films obtained from the resist underlayer film forming compositions prepared in Examples 1 to 16 and Comparative Examples 1 and 2 described in the present specification was compared with the dry etching rate of the photoresist film formed from the photoresist solution (PAR 710) manufactured by Sumitomo Chemical Co., Ltd. The dry etching rate of each of the resist underlayer films obtained from the resist underlayer film forming compositions of Examples and Comparative Examples when assuming the dry etching rate of the photoresist film as 1.00 is shown as "selection ratio" in Table 1.

TABLE 1

| | n value | k value | Selection ratio | Odor of raw material monomer |
|---|---|---|---|---|
| Example 1 | 1.94 | 0.26 | 2.05 | None |
| Example 2 | 1.89 | 0.31 | 1.94 | None |
| Example 3 | 1.92 | 0.27 | 2.00 | None |
| Example 4 | 1.94 | 0.26 | 2.04 | None |
| Example 5 | 1.92 | 0.29 | 1.98 | None |
| Example 6 | 1.93 | 0.27 | 1.99 | None |
| Example 7 | 1.93 | 0.27 | 2.00 | None |
| Example 8 | 1.93 | 0.27 | 2.00 | None |
| Example 9 | 1.96 | 0.30 | 2.01 | None |
| Example 10 | 1.96 | 0.31 | 1.98 | None |
| Example 11 | 1.91 | 0.25 | 1.99 | None |
| Example 12 | 1.89 | 0.28 | 1.98 | None |
| Example 13 | 1.95 | 0.27 | 1.79 | None |
| Example 14 | 1.93 | 0.29 | 1.77 | None |
| Example 15 | 1.93 | 0.24 | 1.96 | None |
| Example 16 | 1.89 | 0.25 | 2.04 | None |
| Comparative Example 1 | 1.98 | 0.35 | 1.96 | Exist |
| Comparative Example 2 | 1.87 | 0.19 | 1.60 | None |

From the results shown in Table 1, it is apparent that the resist underlayer film obtained from the resist underlayer film forming composition of the present invention has a satisfactorily high n value and a satisfactorily low k value to light of wavelength 193 nm. Further, it is also apparent that the resist underlayer film obtained from the resist underlayer film forming composition of the present invention has a selection ratio of dry etching rate larger than that of a photoresist. Therefore, the time required for removing the resist underlayer film by dry etching can be reduced and then, such an undesired phenomenon that the film thickness of the photoresist film decreases along with the removal of the resist underlayer film by dry etching can be suppressed.

On the contrary, the resist underlayer film obtained from the resist underlayer film forming composition prepared in Comparative Example 1 has a k value larger than that of any of the resist underlayer films obtained from the resist underlayer film forming compositions of the present invention. The resist underlayer film obtained from the resist underlayer film forming composition prepared in Comparative Example 2 has a selection ratio of a dry etching rate smaller than that of any of the resist underlayer films obtained from the resist underlayer film forming compositions of the present invention. Further, odor due to a raw material monomer is not problematic in the resist underlayer film forming compositions of the present invention. However, odor due to a raw material monomer is noticeable in the resist underlayer film forming composition prepared in Comparative Example 1.

(Formation of Resist Pattern)

An example of forming a resist underlayer film and forming a resist pattern on the resist underlayer film is shown as follows. The resist underlayer film forming composition prepared in each Example described in the present specification is applied by a spinner on a substrate in which an insulating film such as an SiON film (nitrogen-containing silicon oxide film) or a low-k (low dielectric constant) film is formed on a silicon wafer, in a thickness of for example, 0.05 μm. Then, the composition is baked on a hot plate (for example, at 205° C. for 1 minute) to form a resist underlayer film having a film thickness of 20 nm to 30 nm. A commercially available photoresist solution (for example, trade name: PAR 855S75; manufactured by Sumitomo Chemical Company Limited) is applied on the resist underlayer film by a spinner, and the solution is baked on a hot plate (for example, at 115° C. for 1 minute) to form a photoresist film.

Next, by using a scanner, for example, NSRS307E manufactured by Nikon Corporation (wavelength: 193 nm, NA: 0.85, σ: 0.65/0.93 (ANNULAR)), exposure is performed through a photomask that is set such that 9 lines of photoresist were formed and the lines had a line width and a width between lines of 0.08 μm, that is, 0.08 μmL/S (dense line) after the development. Subsequently, the resist pattern is subjected to a post exposure bake (PEB) on a hot plate, for example at 105° C. for 60 seconds, is cooled down, and then is developed at a 60 second single paddle-type process according to JIS using a 0.26 N tetramethylammonium hydroxide aqueous solution as a developer. Through the above processes, a resist pattern can be formed.

(Evaluation of Photoresist Pattern Shape)

Each of the resist underlayer film forming compositions prepared in Examples 1, 2, and 4 to 8 described in the present specification was applied by a spinner on a substrate in which an SiON film (nitrogen-containing silicon oxide film) was evaporated on a silicon wafer in a thickness of 0.05 μm. Then, the composition was baked on a hot plate at 205° C. for 1 minute to form a resist underlayer film having a film thickness of 20 nm to 30 nm. On the resist underlayer film, a commercially available photoresist solution (trade name: PAR 855S75; manufactured by Sumitomo Chemical Company Limited) was applied by a spinner and the solution was baked on a hot plate at 115° C. for 60 seconds to form a photoresist film (film thickness: 0.12 μm).

Next, by using a scanner NSRS307E manufactured by Nikon Corporation (wavelength: 193 nm, NA: 0.85, σ: 0.65/0.93 (ANNULAR)), an exposure was performed through a photomask set so that 9 lines of photoresist having a line width and a width between lines both of which were 0.08 μm, that is 0.08 μmL/S (dense line) after the development were formed. Subsequently, the resist pattern was subjected to a post exposure bake (PEB) on a hot plate at 105° C. for 60 seconds, was cooled down, and then was developed at a 60 second single paddle-type process according to JIS using a 0.26 N tetramethylammonium hydroxide aqueous solution as a developer.

A cross section of the obtained photoresist pattern in a direction perpendicular to the substrate, that is, the silicon wafer was observed by a scanning electron microscope (SEM). As a result of the observation, it was observed that a cross sectional shape of each photoresist pattern obtained was an advantageous straight skirt shape and a substantially rectangular shape. SEM images obtained by photographing cross sections of the photoresist patterns finally formed on the substrates using the resist underlayer film forming compositions of Examples 2, 4, 5, 6, and 8 are each shown in FIGS. 1A to 1E.

BRIEF DESCRIPTION OF THE DRAWINGS

FIG. 1A is an SEM image obtained by photographing a cross section of the photoresist pattern finally formed on the substrate using the resist underlayer film forming composition of Example 2. FIG. 1B is an SEM image obtained by photographing a cross section of the photoresist pattern finally formed on the substrate using the resist underlayer film forming composition of Example 4. FIG. 1C is an SEM image obtained by photographing a cross section of the photoresist pattern finally formed on the substrate using the resist underlayer film forming composition of Example 5. FIG. 1D is an SEM image obtained by photographing a cross section of the photoresist pattern finally formed on the substrate using the resist underlayer film forming composition of Example 6. FIG. 1E is an SEM image obtained by photographing a cross section of the photoresist pattern finally formed on the substrate using the resist underlayer film forming composition of Example 8.

The invention claimed is:

1. A resist underlayer film forming composition for lithography comprising:

a polymer having a disulfide bond in backbone thereof: and a solvent:

wherein the polymer has a repeating unit structure of Formula (1):

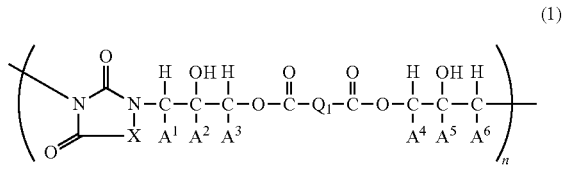

(1)

where X is a group of Formula (2), Formula (3), or Formula (4):

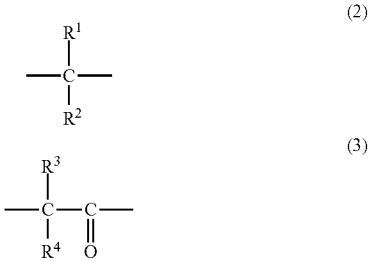

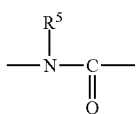

where $R^1$ to $R^5$ are each independently a hydrogen atom, a $C_{1-6}$ alkyl group, a $C_{3-6}$ alkenyl group, a benzyl group, or a phenyl group, where the phenyl group is optionally substituted with at least one group selected from a group consisting of a $C_{1-6}$ alkyl group, a halogen atom, a $C_{1-6}$ alkoxy group, a nitro group, a cyan group, and a $C_{1-6}$ alkylthio group, and $R^1$ and $R^2$ or $R^3$ and $R^4$ are optionally bonded to each other to form a $C_{3-6}$ ring;

$A^1$ to $A^6$ are each independently a hydrogen atom, a methyl group, or an ethyl group;

$Q^1$ is a divalent group containing a disulfide bond; and n is the number of repeating unit structures which is an integer of 5 to 100.

2. The resist underlayer film forming composition for lithography according to claim 1, wherein Formula (1) is Formula (5):

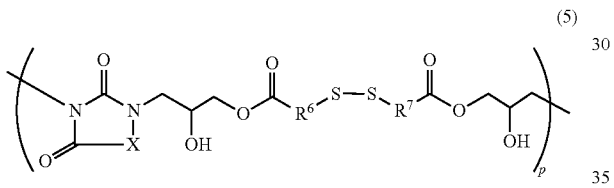

where X is a group of Formula (2), Formula (3), or Formula (4); $R^6$ and $R^7$ are each independently a $C_{1-3}$ alkylene group or a direct bond; and p is the number of repeating unit structures which is an integer of 5 to 100.

3. The resist underlayer film forming composition for lithography according to claim 1, further comprising:
 a crosslinkable compound; and
 a sulfonic acid compound.

4. The resist underlayer film forming composition for lithography according to claim 1, further comprising a surfactant.

5. A method for forming a resist pattern used in the production of a semiconductor device comprising:
 applying the resist underlayer film forming composition for lithography as claimed in claim 1 on a semiconductor substrate and baking the composition to form a resist underlayer film;
 applying a resist on the resist underlayer film and baking the resist to form a resist film;
 exposing the semiconductor substrate coated with the resist underlayer film and the resist film to light; and
 developing the resist film after the exposure.

6. A resist underlayer film forming composition for lithography comprising:

a solvent; and
a polymer having a repeating unit structure of Formula (6):

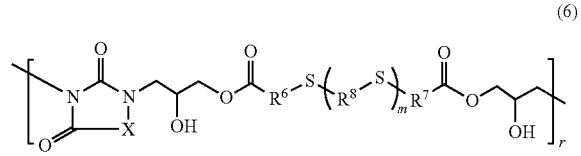

where
X is a group of Formula (2), Formula (3), or Formula (4):

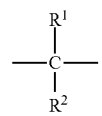

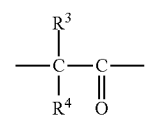

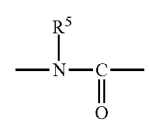

where $R^1$ to $R^5$ are each independently a hydrogen atom, a $C_{1-6}$ alkyl group, a $C_{3-6}$ alkenyl group, a benzyl group, or a phenyl group, where the phenyl group is optionally substituted with at least one group selected from a group consisting of a $C_{1-6}$ alkyl group, a halogen atom, a $C_{1-6}$ alkoxy group, a nitro group, a cyano group, and a $C_{1-6}$ alkylthio group, and $R^1$ and $R^2$ or $R^3$ and $R^4$ are optionally bonded to each other to form a $C_{3-6}$ ring:

$R^6$ and $R^7$ are each independently a $C_{1-3}$ alkylene group or a direct bond;

$R^8$ is a $C_{1-3}$ alkylene group;

m is 0 or 1; and r is the number of repeating unit structures which is an integer of 5 to 100.

7. The resist underlayer film forming composition for lithography according to claim 6, further comprising:
 a crosslinkable compound; and
 a sulfonic acid compound.

8. The resist underlayer film forming composition for lithography according to claim 6, further comprising a surfactant.

9. A method for forming a resist pattern used in the production of a semiconductor device comprising:
 applying the resist underlayer film forming composition for lithography as claim in claim 6 on a semiconductor substrate and baking the composition to form a resist underlayer film;
 applying a resist on the resist underlayer film and baking the resist to form a resist film;
 exposing the semiconductor substrate coated with the resist underlayer film and the resist film to light; and
 developing the resist film after the exposure.

* * * * *